United States Patent
Karg et al.

(10) Patent No.: US 8,212,269 B2
(45) Date of Patent: Jul. 3, 2012

(54) ORGANIC LIGHT EMITTING DEVICE, METHOD FOR PRODUCING THEREOF AND ARRAY OF ORGANIC LIGHT EMITTING DEVICES

(75) Inventors: Siegfried F. Karg, Adliswil (CH); Hajime Nakamura, Chigasakihiga (JP); Heike E. Riel, Baech (CH); Walter H. Riess, Thalwil (CH); Constance Rost-Bietsch, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 11/719,426

(22) PCT Filed: Oct. 21, 2005

(86) PCT No.: PCT/IB2005/003316
§ 371 (c)(1),
(2), (4) Date: Aug. 20, 2009

(87) PCT Pub. No.: WO2006/054137
PCT Pub. Date: May 26, 2006

(65) Prior Publication Data
US 2010/0001301 A1  Jan. 7, 2010

(30) Foreign Application Priority Data
Nov. 16, 2004 (EP) .................. 04405706

(51) Int. Cl.
*H01L 33/00* (2010.01)
(52) U.S. Cl. .................... 257/98; 428/690
(58) Field of Classification Search .......... 428/690; 257/98
See application file for complete search history.

(56) References Cited

U.S. PATENT DOCUMENTS

| | | | |
|---|---|---|---|
| 5,739,545 A | 4/1998 | Guha et al. | |
| 6,274,295 B1 | 8/2001 | Dammel et al. | |
| 6,876,018 B2 | 4/2005 | Ko | |
| 2001/0004188 A1 | 6/2001 | Jacobsen | |
| 2001/0048272 A1 | 12/2001 | Hashimoto | |
| 2003/0155860 A1 | 8/2003 | Choi et al. | |
| 2003/0174275 A1* | 9/2003 | Asano et al. | 349/187 |
| 2004/0214041 A1* | 10/2004 | Lu et al. | 428/690 |

(Continued)

FOREIGN PATENT DOCUMENTS

WO  WO2004032576 A1  4/2004

(Continued)

OTHER PUBLICATIONS

ISR, Feb. 24, 2006.

(Continued)

*Primary Examiner* — Kenneth Parker
*Assistant Examiner* — Dale E Page
(74) *Attorney, Agent, or Firm* — Anthony J. Canale (57) ABSTRACT

The present invention is directed to an organic light emitting device (OLED) including a first electrode, a second electrode, at least one layer of organic material arranged between the first electrode and the second electrode, and a dielectric capping layer arranged on the second electrode opposite to the first electrode, wherein the capping layer comprises an outer surface, opposite to the second electrode, for emission of light generated in the at least one layer of organic material. The capping layer has the effect that a reflectance of external light is reduced whereas outcoupling of the light generated in the at least one layer of organic material through the capping layer is increased.

5 Claims, 5 Drawing Sheets

U.S. PATENT DOCUMENTS

2005/0110400 A1* 5/2005 Nakamura .................... 313/506

FOREIGN PATENT DOCUMENTS

WO    WO2004048272    6/2004

OTHER PUBLICATIONS

ISR corrected, Apr. 11, 2006.

"Application of an Ultrathin LiF/Al Bilayer in Organic Surface-Emitting Diodes", L.S. Hung, C.W. Tang, M.G. Mason, P. Raychaudhuri, and J. Madathil vol. 78, No. 4, pp. 544-546, Jan. 22, 2001 American Institute of Physics.

"Optimized OLED Structures for a-Si Display Applications via Combinatorial methods and Enhanced Outcoupling" W. Rieb, T. A. Beierlein, H. Riel Physica Status Solidi A Wiley-VCH Germany, vol. 201, No. 6, May 6,2004, pp. 1360-1371, XP008058355.

"Tuning the Emission Characteristics of Top-Emitting Organic Light-Emitting Devices by Means of a Dielectric Capping Layer: An Experimental and Theoretical Study"., H. Riel, S. Karg, T. Beierlein & W. Rieb—IBM Research, Zurich Research Lab., K. Neyts—University of Ghent Journal of Applied Physics. vol. 94, No. 8 pp. 5290-5296 Published Oct. 15, 2003.

"Phosphorescent Top-Emitting Organic Light-Emitting Devices with Improved Light Outcoupling" H. Riel, S. Karg, T. Beierlein, B. Ruhstaler & W. Rieb American Institute of Physics. vol. 82 No. 3 Applied Physics Letters Pub Jan. 20, 2003, pp. 466-468.

* cited by examiner

ORGANIC LIGHT EMITTING DEVICE, METHOD FOR PRODUCING THEREOF AND ARRAY OF ORGANIC LIGHT EMITTING DEVICES

FIELD OF THE INVENTION

The invention relates generally to optical devices. More particularly, the invention relates to an Organic Light Emitting Device (OLED), a method for producing thereof and an array of organic light emitting devices.

BACKGROUND

In the last few years, mobile information and telecommunication devices such as Notebooks and personal digital assistants have experienced fast development. The corresponding devices are becoming lighter and more efficient. Recently, flat panel displays are becoming more and more popular for such devices. Currently, liquid crystal displays (LCDs) are used as flat panel displays, although LCDs have some disadvantages, e.g. the need for background lighting and a limited viewing angle.

Besides liquid crystals, Organic Light Emitting Diodes, so-called "organic LEDs", or "OLEDs", can be used in flat panel displays. Such organic LEDs have a higher luminous efficiency and an increased viewing angle. The basic feature of the organic LED is the electroluminescence of specific organic materials. The specific organic material determines in a first approximation the color, i.e. the wavelengths, of the light emitted by the corresponding organic LED.

Figure 1:
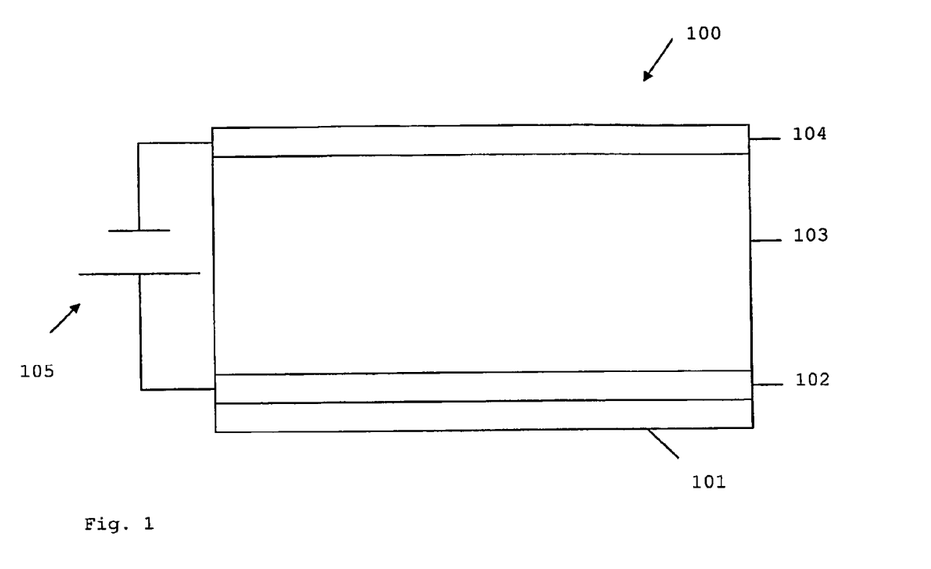
FIG. 1 shows a schematic view of a conventional organic light emitting diode.

FIG. 1 shows a schematic view of a conventional organic LED 100. The common organic LED 100 comprises a substrate 101, which is usually made of glass or a similar transparent material. An anode layer 102 is formed on the substrate 101. Preferably the anode layer 102 is made of a material having a relatively high work function and is substantially transparent for visible light. Therefore, a typical material for the anode layer 102 is indium tin oxide (ITO). A layer 103 of electroluminescent material is formed on the anode layer 102, serving as the emitting layer 103 of the organic LED 100. Common materials for forming the emitting layer 103 are polymers like Poly(p-phenylenvinylen) (PPV) and molecules like tris (8-oxychinolinato) aluminum (Alq3). In the case of molecules the emitting layer 103 typically comprises several layers of the molecules. A cathode layer 104 of material having a lower work function like aluminum (Al), calcium (Ca) or magnesium (Mg) is formed on the emitting layer 103. The cathode layer 104 and the anode layer 102 are in operation connected to a power supply 105.

The basic principles of electroluminescence and, thus, of the organic LED are the following. The anode layer 102 and the cathode layer 104 inject charge carriers, i.e. electrons and holes, into the emitting layer 103, i.e. the active layer. In the emitting layer 103 the charge carriers are transported and the charge carriers of opposite charge form so called excitons, i.e. excited states. The excitons decay radiatively into the ground state by generating light. The generated light is then emitted by the organic LED through the anode layer 102, which is made of transparent material like ITO. The color of the generated light depends on the material used for the organic layer 103.

Furthermore, a so-called multilayer organic LED is known. The multilayer organic LED comprises a plurality of cathode layers and/or a plurality of organic layers and/or a plurality of anode layers. By using a plurality of organic layers, the efficiency of the organic LED can be increased compared to the organic LED comprising a single organic layer. The boundary surface between two organic layers of the plurality of organic layers can act as a barrier which reduces the current flow through the diode for at least one charge carrier type (electrons or holes). Therefore, the at least one charge carrier type accumulates at the boundary surface and thus the recombination probability of the electrons and the holes is increased leading to a higher efficiency of the organic LED.

In "Application of an Ultrathin LiF/Al bilayer in Organic Surface-Emitting Diodes", L. S. Hung et. al., Applied Physics Letters Vol. 78, No. 4 (22, Jan. 2001), pp. 544-546, an organic LED is disclosed in which the generated light is emitted through the cathode of the organic LED instead of emitting the light through the anode. A schematic illustration of such an organic LED is shown in FIG. 2. An indium tin oxide (ITO) layer 201 is provided as a substrate of the organic LED 200. An α-naphtylphenylbiphenyl diamine (NPB) layer 202 is formed on the ITO substrate 201 to act as a hole transport layer. Underneath the ITO substrate 201 a reflecting silver mirror 209 is formed. An $Alq_3$ layer 203 is formed on the hole transport layer 202 to act as an electron-transport/emissive layer. Further, a cathode 204 is formed on the $Alq_3$ layer 203.

The cathode 204 is formed by a plurality of cathode layers as a so-called multilayer cathode structure which is optically transmissive and which is effective as an electron-injecting contact for the organic LED. The multilayer cathode structure comprises an ultrathin layer of lithium fluoride (LiF) 205, an Al layer 206 as the electron-injecting contact and a silver layer 207 for sheet resistance reduction. Furthermore, a transparent dielectric layer 208 for enhancement of optical transmission is formed on the multilayer cathode structure. This transparent, dielectric layer 208 is used for increasing the efficiency of emitting the light through the cathode 204, i.e. the multilayer cathode structure.

In this organic LED, generated light is emitted through the cathode 204. Such an organic LED is also referred to as a top-emitting organic LED. The top-emission is possible, since the cathode 204 comprises a LiF/Al bilayer. A reasonable thickness of the LiF layer 205 is given to be about 0.3 nm and a reasonable thickness of the Al layer 206 to be between 0.1 nm and 1.0 nm. For the dielectric layer 208, also referred to as a "capping layer", $Alq_3$ or MgO can be used.

Figure 2A:
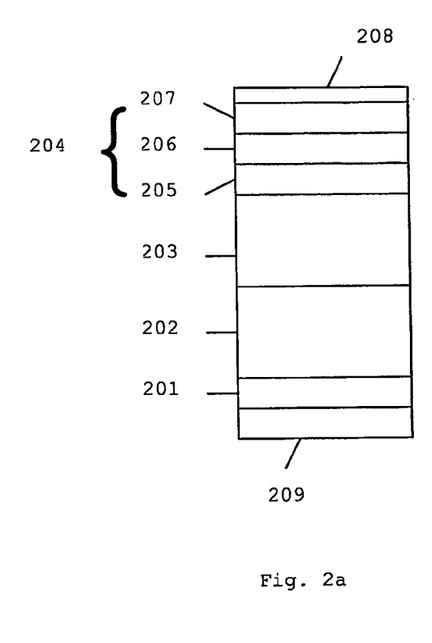
FIG. 2 shows a schematic view of three subpixels emitting light of different wavelength comprising conventional organic light emitting diodes.
Figure 2B:
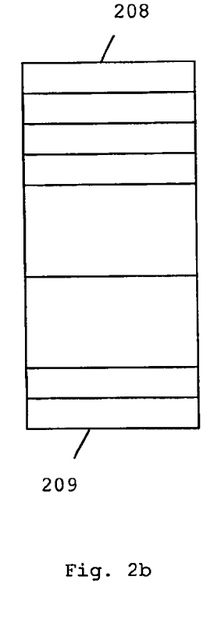
Figure 2C:
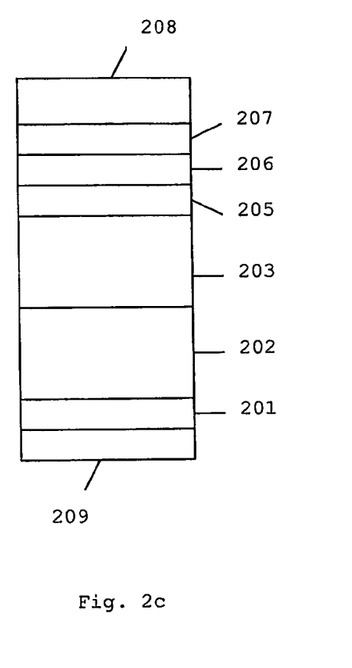

One disadvantage of this top-emitting organic LED is that the thickness of the refractive dielectric layer 208 has to be adjusted to the color of the organic LED, i.e. the wavelength of the light emitted from the specific organic LED. That is, each organic LED emitting a different color has to have a different thickness of the refractive layer 208 in order to increase the efficiency of the organic LED. Thus, when a flat panel display comprising organic LEDs emitting different colors is manufactured, the thickness of the refractive dielectric layers 208 for organic LEDs of each color is different. To schematically illustrate this disadvantage, FIG. 2 is divided into three parts 2a, 2b, 2c. FIG. 2a depicts an organic LED for emitting light of a relatively short wavelength, e.g. blue light, and has a refractive dielectric layer 208 that is relatively thin. FIG. 2b depicts an organic LED for emitting light of a medium wavelength, e.g. green light or yellow light, and has a refractive dielectric layer 208 that is thicker than the refractive dielectric layer 208 shown in FIG. 2a. FIG. 2c, depicts an organic LED for emitting light of a relatively long wavelength, e.g. red light, and has a refractive dielectric layer 208 that is thicker than those shown in FIGS. 2a and 2b. With increasing wavelength a longer optical pathlength in the refractive dielectric layer 208 is required to achieve the object of the refractive dielectric layer 208, that is to increase the light output of the organic LED. Furthermore, the thicknesses of the α-naphtylphenylbiphenyl diamine (NPB) layer 202 and of the Alq₃ layer 203 of the organic LED have to be adapted as well.

Therefore, in a display with a plurality of red, green and blue pixels, wherein each pixel is realized by a single organic LED, refractive dielectric layers 208 having a different layer thickness for each color have to be deposited on the organic LEDs. This leads to a complex and hard to handle production method of the display comprising a plurality of organic LEDs, i.e. for every thickness of the refractive dielectric layer 208 a separate process step is necessary.

Another disadvantage of such an organic LED is that, although the refractive dielectric layer 208 enhances the light output, i.e. the luminous intensity, the contrast ratio of the organic LED is still relatively low.

It is desired to overcome at least some of the disadvantages of conventional organic LEDs.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

The present invention relates to an organic LED with a relatively high luminous intensity and a relatively high contrast ratio. An array of the organic LEDs according to the present invention can be produced in a relatively simpler production method compared to production methods for conventional organic LED arrays.

An aspect of the present invention is directed to an organic light emitting device comprising a multilayer structure with a first electrode, a second electrode, at least one layer of organic material arranged between the first electrode and the second electrode, and a dielectric capping layer, arranged on the second electrode. The capping layer is selected to have the effect that the reflectance of external light is reduced whereas outcoupling of the light generated in the at least one layer of organic material through the capping layer is increased. Preferably, a material is chosen for the capping layer that allows selection of a thickness thereof at which the reflectance is reduced to a local minimum and, at the same thickness, the outcoupling of the light generated, also referred to as luminance, is also at or near a local maximum.

In another aspect of the present invention a method for manufacturing an organic light emitting device with a first electrode, a second electrode, at least one layer of organic material, arranged between the first electrode and the second electrode, and a capping layer, arranged on a side of the second electrode that is opposite to the first electrode, comprising an outer surface opposite to the second electrode for emission of light generated in the at least one layer of organic material is provided. The method comprises the steps of: providing a first electrode, forming at least one organic layer on the first electrode, forming a second electrode on the at least one organic layer and forming a capping layer on the second electrode. Due to the capping layer, the reflectance of external light is reduced and the outcoupling of the light generated in the at least one layer of organic material of the capping layer is increased.

In another aspect of the present invention, an array of a plurality of organic light emitting devices is provided. Each organic light emitting device comprises a multilayer structure with a first electrode, a second electrode, at least one layer of organic material arranged between the first electrode and the second electrode, and a dielectric capping layer arranged on the second electrode opposite to the first electrode, wherein the capping layer comprises an outer surface, opposite to the second electrode, for emission of light generated in the at least one layer of organic material. The capping layer of each organic light emitting device effects a reduction of the reflectance of external light whereas outcoupling of the light generated in the at least one layer of organic material through the capping layer is increased. At least one organic light emitting device of the plurality of organic light emitting devices emits light of a color which is different from a color of the light of another organic light emitting device of the plurality of organic light emitting devices. Further, the capping layers of each of the plurality of organic light emitting devices have a substantially equal thickness. Preferably, the thickness is adapted such that for a selected set of materials for the first electrode and the second electrode, the reflectance of external light is reduced whereas outcoupling of the light generated in the at least one layer of organic material through the capping layer is increased.

A feature of the present invention is that the capping layer of the organic light emitting device (OLED) can exhibit the same thickness across the entire capping layer, while at the same time the reflectance of the entire OLED, i.e. the entire OLED stack, is reduced and the ruminant intensity, i.e. the luminous intensity, is increased. It was discovered that it is possible to improve the reflectance and the luminance at the same time, thus leading to an organic light emitting device (OLED) with a higher luminous intensity and efficiency as well as a higher contrast ratio.

An advantage of an array of OLEDs according to the present invention is that the thickness of the capping layers of each OLED can be selected substantially the same regardless of the color of the light each single OLED emits. Therefore, the producing method of an array of OLEDs, e.g. a display, can be simplified. Furthermore, the array can be produced in such a manner that the light emitting surface, i.e. the surface which is formed by the outer surfaces of the capping layers, is a substantially even surface. For example the light emitting surface can be formed as a planar surface or as a curved surface in case the underlying layers of the OLED are already curved.

In the present context, the thickness of the capping layer is measured from the boundary surface between the second electrode and the capping layer to the outer surface of the capping layer. Furthermore, the expression "reflectance" is to be understood as the reflectivity of the whole OLED device, i.e. the ratio of intensity of the reflected ray and the intensity of the incoming ray. In particular, by reducing the reflectance of the whole OLED device, the reflection of external light, i.e. incoming light of an external source such as, for example, the Sun or an artificial light source in an office, is reduced. This can be achieved by adapting the thickness of the capping layer to a thickness so that destructive interference occurs between an incoming ray which is reflected from one boundary surface, e.g. the outer surface of the capping layer of the OLED and another incoming ray which is reflected from another boundary surface, e.g. from the boundary surface between the organic layer adjacent to the first electrode layer and the first electrode of the OLED.

In an embodiment of the present invention, the first electrode comprises a reflecting layer. Preferably, the reflecting layer is arranged on the first electrode opposite to the at least one layer of organic material, i.e. the first electrode is arranged between the reflecting layer and the at least one layer of organic material. The first electrode can also comprise a plurality of sub-layers.

Preferably, the reflecting layer can comprise a dielectric layer. In another embodiment the reflecting layer comprises a metallic layer, in particular an aluminum layer or a silver layer.

The reflecting layer provides the advantage that the efficiency of the organic light emitting device can be increased, since the generated light is reflected from the reflecting layer in the direction to the second electrode. In particular, aluminum is a suitable material for a reflecting layer of an OLED, since it can be easily processed with common processing steps and is a low cost material. Furthermore, aluminum is easily processed to exhibit a high reflectivity and thus is suitable to provide a reflecting layer which at the same time can be used as an electrode of the OLED if the surface is treated in a certain way which is described in WO 03/055275, which is incorporated by reference herein, for example. By using a reflecting layer the efficiency of the top-emitting OLED can be increased to a higher value than that of an OLED emitting through a transparent first electrode, a so-called "through-substrate-emitting OLED".

Preferably, the first electrode comprises indium tin oxide. Indium tin oxide (ITO) is a suitable material for the first electrode of an OLED, since ITO is transparent and exhibits a relatively high work function.

In another embodiment of the present invention, the organic light emitting device comprises a plurality of layers of organic material arranged between the first electrode and the second electrode. By using a plurality of organic material layers, the efficiency of the OLED can be further increased. The boundary surface between two organic material layers of the plurality of organic material layers can act as a barrier which prevents the current flow through the OLED for at least one charge carrier type (electrons or holes). Therefore, the at least one charge carrier type accumulates at the boundary surface and thus the recombination probability of the electrons and the holes is increased leading to a higher efficiency of the OLED.

In another embodiment of the present invention, the second electrode comprises a plurality of second electrode sublayers. Preferably, the second electrode comprises, for example, a LiF-layer, an Al-layer, a $Li_2O$-layer, a CsF-layer, a Li-benzoate layer, a Li-acetonate, a calcium layer, a magnesium layer, a titanium layer, or a silver layer. All these materials are materials which are suitable as the material for the second electrode and provide a relatively low work function. In particular a second electrode comprising a LiF-layer and/or an Al-layer is efficient since it provides a relatively low work function. At the same time the second electrode with a thin LiF/Al layer is appropriate to emit light generated by the OLED there through. An appropriate thickness of the LiF-layer is in the range of about 0.3 nanometers (nm) while an appropriate thickness of the Al-layer is between about 0.1 nm and about 1.0 nm.

Preferably, the thickness of the capping layer is adapted to reduce the reflectance of an external light source for different wavelengths of light. By adapting the thickness of the capping layer so that it improves the device performance for different wavelengths of light it is possible to produce a display comprising OLEDs emitting different color of light in an easy way, since the thickness of the capping layer is preferably substantially the same for the different colors of light, e.g. red, green and blue.

Furthermore, if electron and/or hole transport layers are used having different thicknesses for the different colors, the thicknesses of the capping layers can be adapted as well to compensate for these differences in the thicknesses of the electron and/or hole transport layers yielding a smooth surface of an OLED array. This adaptation can be achieved by choosing material with suitable refractive indices for different wavelengths such that an even or planar surface of the OLED can be achieved. That is, the material and/or the refractive indices of the material of the capping layers for the different colors is/are chosen such that the differences in the optical path lengths for the different colors are the same as the differences in the thicknesses of the electron and/or hole transport layers for the different colors. The optical path lengths are such that the reflectance of several colors of the OLED, and preferably of the entire OLED, i.e. the entire OLED stack, is reduced and the ruminant intensity, i.e. the luminous intensity, is increased.

In another embodiment of the present invention, the capping layer comprises a plurality of capping sub-layers. Preferably, the refractive index of each capping sub-layer is different. The refractive indexes of the individual capping sub-layers can increase or decrease monotonically in respect of a distance of each individual capping sub-layer from the first electrode. The monotonous increase or the monotonous decrease of the refractive index of the sub-layers provides, in a descriptive way, a gradient in the refractive index of the capping layer over the thickness of the capping layer.

According to another embodiment of the present invention, the capping layer comprises a material with anomalous dispersion. By using a material with anomalous dispersion for the capping layer it is possible to achieve a capping layer that is adapted for different wavelengths of light although the capping layers of OLEDs emitting light of different color have the same thickness. This is possible due to the fact that a material with anomalous dispersion has an increasing refractive index with increasing wavelength of light. Thus, the optical pathlength, which is crucial for the usage of a capping layer, increases with the wavelength. Therefore, an increase of the refractive index with the wavelength and the increase of the optical pathlength can be matched with each other. Thus, a thickness of the capping layer being the same for all capping layers regardless of the color of the light emitted by the corresponding OLED, e.g. OLED emitting red, green or blue light, can be achieved.

The material of the capping layer can be selected from one or more of the following materials: PbSe, PbS, ZnSe, ZnS or PbTe. All of these materials are materials which exhibit anomalous dispersion in the complete or part of the wavelength interval common OLEDs refer to, namely the interval of visible light, essentially from about 400 nm to 700 nm. A suitable material for the capping layer has a refractive index between 1.6 and 4, preferably between 2 and 3. The dispersion of the material of the capping layer is most preferably in such a range that the refractive index is about 2.3 for light of a wavelength of 400 nm and about 2.7 for light of a wavelength of 700 nm. However, materials with a lower refractive index like 1.6 to 2.2 or a higher refractive index like 2.8 to 4 provide already an improvement compared to OLEDs without a capping layer. Thus, with these materials, the improvement by means of the capping layer regarding the reduction of the reflectance of the outer surface of the capping layer and regarding the increase of the transmittance of the capping layer can be achieved in an easy way.

In another embodiment of the present invention, the capping layer comprises, for example, a ferroelectric material or a liquid crystalline material. Ferroelectric materials as well as liquid crystalline materials exhibit the possibility to control the refractive index of the materials. Thus, the refractive index and in conjunction with the refractive index the optical pathlength can be controlled. Therefore, it is possible to tune the refractive index and to calculate a thickness of the capping layer which serves for reducing the reflectance of external light for a selected set of first electrode, e.g. anode, and second electrode, e.g. cathode materials, whereas the outcoupling of generated light through the capping layer is increased. Ferroelectric materials and liquid crystalline materials can be controlled to act as materials having an anomalous dispersion, in particular acting as materials having a controllable dispersion.

The capping layer can be arranged between a third electrode and a fourth electrode. By arranging the capping layer comprising a ferroelectric material or a liquid crystal material between two electrodes, an efficient way for controlling the refractive index of the capping layer is provided. These materials change their refractive index according to the strength of an electric field they are exposed to. Thus, the refractive index for each color can be set individually, simulating an anomalous dispersion of the capping layer, by arranging the capping layer between the third and the fourth electrodes and changing the electric field provided by these electrodes. For example, the liquid crystalline materials MBBA (p-methoxybezylidene-p'-butylaniline) and BMAOB (p-butyl-p'-methoxy-azooxybenzene) change their refractive indices from 1.5 to 1.8 and 1.6 to 2.0 respectively. In the case of a liquid crystalline material as the capping layer, the third electrode is preferably treated in such a way, e.g. with diamond-like carbon, that the liquid crystalline material aligns with the orientation of the layer the liquid crystalline material is arranged on. According to the present invention, the first electrode or the second electrode can be used also as the third electrode.

Summarizing, according to one aspect of the present invention, the luminous intensity and in particular the contrast ratio of a top-emitting organic light emitting device (OLED), e.g. an organic light emitting diode or any device which emits light when a current is flowing through the device, is increased by providing a dielectric capping layer formed on one electrode layer of the OLED. A suitable material exhibiting this characteristic can be selected for providing this advantageous function. Preferably, a material can be selected whose luminance increases with an increase of the capping layer thickness within a predetermined range of the capping layer thickness, preferably between about 1 nm and about 50 nm. More preferably, a material can be selected whose reflectance decreases with an increase of the capping layer thickness within a pre-determined thickness range, and, in the same thickness range, is available for the luminance increase. In a preferred embodiment, a thickness can be selected for the capping layer at which the luminance shows at least a local maximum and at which the reflectance is or is relatively close to at least a local minimum. "Relatively close" can be interpreted as being within a range of about 10 nm from the next minimum, preferably even below about 5 nm distance from the minimum. The dielectric capping layer can be formed on either the anode or the cathode of the OLED depending on the choice of through which electrode the light is emitted by the OLED. The thickness of the capping layer can be adapted to improve the reflection of external light and the outcoupling of generated light through the capping layer to a desired value within the physically possible range. In particular, the thickness of the capping layer can be determined in such a way that the thickness is equal for different wavelengths of the light emitted by the OLED.

In particular, by adapting the reflectance of the surface of the capping layer, the reflection of incoming light of an external source is reduced, thereby improving the contrast ratio of the OLED. This can be achieved by adapting the thickness of the capping layer to a thickness so that destructive interference occurs between an incoming ray which is reflected from one boundary surface, e.g. the outer surface of the capping layer of the OLED and another incoming ray which is reflected from another boundary surface, e.g. from the boundary surface between the first organic layer and the first electrode layer, e.g. the anode, of the OLED.

Preferably, the capping layer is made of a dielectric material exhibiting anomalous dispersion so that the optical pathlength through the capping layer increases with increasing wavelength of through-passing light. Whereas conventional dielectric materials show normal dispersion, some dielectric materials, for example, narrow bandgap semiconductors such as PbTe, PbSe; some glasses or liquids; or, PbS, ZnS, ZeSn or a combination thereof, show anomalous dispersion thus qualifying these materials as materials suitable to be selected for the capping layer. With an anomalous-dispersion material, the optical pathlength increases with increasing wavelength at a given thickness of the capping layer, whereas conventional dielectric materials showing normal dispersion exhibit a decrease of the optical pathlength with increasing wavelength. The refractive index of the material of the capping layer preferably is about 2.3 for a wavelength of 400 nm and about 2.7 for a wavelength of 700 nm. However, materials with a lower refractive index between 1.6 and 2.2 or a higher refractive index of more than 2.7 provide already an improvement compared to OLEDs without capping layer. Thus, by using dielectric materials showing anomalous dispersion for the capping layer there is provided an easy way to allow use of the same thickness of capping layers arranged on the cathode of OLEDs emitting light of different colors. This leads to the advantages of a simplified production method with less patterning efforts for an array of different OLEDs, i.e. OLEDs emitting light of different colors.

Alternatively or in addition, the capping layer can comprise, for example, a ferroelectric material or a liquid crystal material having a refractive index which can be set by an external electrical field. Thus, if a capping layer comprising these materials is sandwiched between two electrodes, the refractive index for each color, i.e. each OLED emitting light of one color, can be set individually.

The present invention discloses ways to fabricate organic light emitting devices with a uniform capping layer thickness for all colors and even to provide OLEDs with electrically tunable optical characteristics. A further benefit of the invention is that capping layers can be tuned such that besides the improved light output, a reduction of reflectivity is obtained to achieve a higher contrast ratio.

Furthermore, beside tuning the thickness of the capping layer, the thickness of all layers of the OLED can be tuned to optimize the OLED, e.g. by reducing the reflectivity and at the same time increasing the outcoupling efficiency of the layers, i.e. increasing the light output of the OLED. The outcoupling efficiency can also be tailored to a viewing angle, i.e. the angle at which the OLED is looked upon by a user. The reduction of the reflectivity by tuning of the thickness can be achieved by using the effect of destructive interference between rays that are reflected at different boundaries between different layers of the OLED. By selection of electrode metals with a predetermined refractive index and absorption coefficient, the interference can be fine-tuned. For destructive interference a relative phase shift between the rays that are brought into interference of $\lambda/2$, i.e. a half of a wavelength or an odd multiple of a half wavelength, is used. Complete annihilation occurs if the sum of the amplitudes match.

The anode and/or the cathode and/or the organic layer of the OLED can be formed either by a single layer or by a multiple layer structure, a so called "stack". Further, a reflecting layer can be formed on one side of the OLED in order to increase the efficiency of the OLED. The reflecting layer can comprise metallic material or a dielectric material.

Figure 3A:
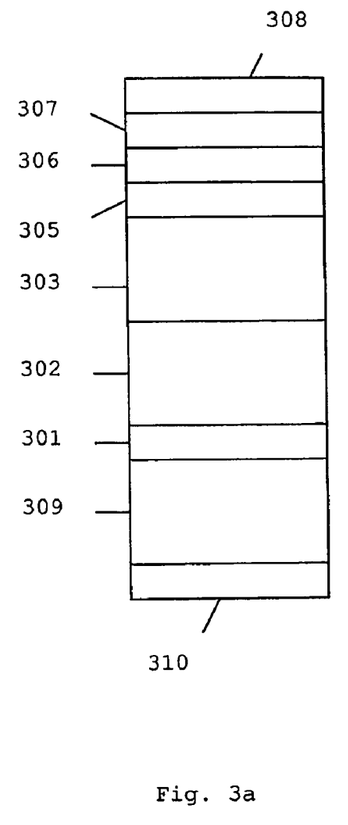
FIG. 3 shows a schematic view of an array comprising organic light emitting devices according to an embodiment of the present invention.
Figure 3B:
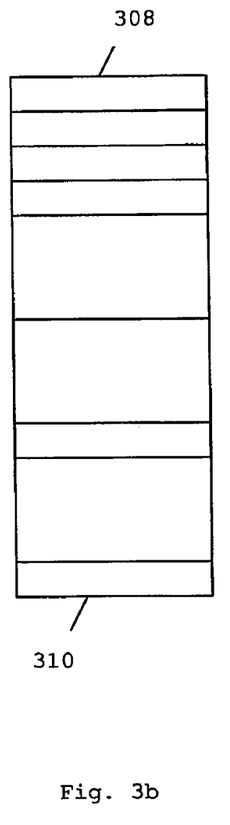
Figure 3C:
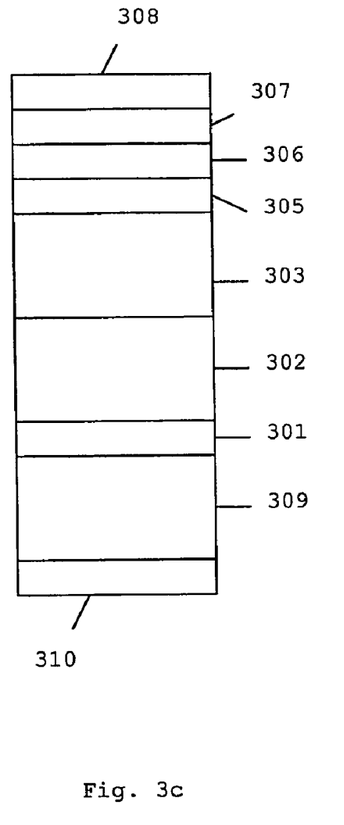

FIG. 3 a-c shows a schematic view of an array of three sub-pixels comprising organic light emitting devices (OLEDs). In an embodiment of the present invention the organic light emitting device is an organic light emitting diode. Each OLED of the array 300 comprises a substrate 309. In the shown embodiment, the substrate 309 is, for example, a glass substrate on which an indium tin oxide (ITO) layer 301 is formed. Underneath the glass substrate 309, i.e. opposite to the ITO layer 301, a mirror layer 310 is formed. The ITO layer 301 is used as a first electrode, e.g. as an anode, of the organic light emitting diode and is connected to a power supply (not shown). The mirror layer 310 is formed to increase the efficiency of the OLED. Such a mirror layer 310 can be formed, for example, by a silver layer or a dielectric material.

Alternatively, the anode 301 can be formed by a layer of aluminum. In this case the mirror layer 310 can be formed by processing the aluminum layer of the anode 301 such that the aluminum of the anode 301 has a reflectivity and acts as the mirror layer itself. If the mirror layer 310 is formed by a dielectric reflecting material, the mirror layer 310 is not used as an electrode so that a separate electrode layer is arranged in case of a dielectric mirror layer 310.

An active part of the OLED, i.e. the organic part of the OLED, can be formed on the ITO layer 301. In the OLED shown in FIG. 3 the active part comprises two sublayers. A first sublayer 302 is formed as a hole transport layer 302. The hole transport layer 302 can be made of α-naphtylphenylbi-phenyl diamine (NPB) or another equivalent conventional material. The second sublayer 303 is formed as an electron transport layer and can be made of tris(8-oxychinolinato) aluminum ($Alq_3$). Alternatively the active part can comprise a single emitting layer made, for example, of $Alq_3$. A preferred thickness of the first sublayer 302 as well as of the second sublayer 303 is about 60 nm each. The organic part of the OLED can be made of an organic material exhibiting electroluminescence, e.g. polymers like poly (p-phenyl envinylen) (PPV).

The active part comprising a plurality of sublayers 302, 303 can be used to increase the efficiency of the OLED. The boundary surface between two sublayers 302, 303 of the active part can act as a barrier which reduces or hampers the flow through the OLED for at least one charge carrier type (electrons or holes). Therefore, the at least one charge carrier type accumulates at the boundary surface and thus the recombination probability of the electrons and holes is increased leading to a higher efficiency of the OLED.

A multilayer structure, a so called "stack", is formed on the active part. The multilayer structure is used as a second electrode, e.g. a cathode, of the OLED. Thus, the schematic OLED shown in FIG. 3 a-c comprises a multilayer cathode structure, i.e. a cathode comprising a plurality of layers. A first layer 305 of the multilayer cathode structure is a lithium fluoride (LiF) layer 305. A preferred thickness for the LiF-layer 305 is about 0.3 nm. The first layer 305 of the multilayer cathode structure is formed on the active part 302, 303. A second layer 306 of the multilayer cathode structure is formed on the first layer 305. The second layer 306 is made of aluminum (Al) and has a preferred thickness between 0.1 nm and 0.6 nm. In the embodiment shown in FIG. 3 a-c the multilayer cathode structure comprises also a third layer 307. The third layer 307 is made of silver and has a preferred thickness of about 20 nm. The object of the silver layer 307 is to reduce the resistance of the cathode.

The cathode is not limited to a multilayer cathode structure but can also be formed of a single layer. A material comprising, for example, aluminum, calcium, magnesium, or magnesium-silver alloy can be used for such a single-layer cathode. Typically, an OLED having a calcium or magnesium cathode provides a luminance in the visible spectrum of light, e.g. at a wavelength about 550 nm, that is about 30% higher than the luminance provided by an OLED having a cathode made of aluminum, if the thickness of the calcium or magnesium layer is the same as the thickness of the aluminum layer.

A capping layer 308 is formed on the cathode stack, i.e. on the third layer 307 of the cathode stack in FIG. 3. The capping layer 308 is in this example made of a dielectric material exhibiting anomalous dispersion in the range of visible light, i.e. light of a wavelength between 400 nm and 700 nm. Anomalous dispersion is the type of dispersion in which the index of refraction n decreases with angular frequency $\omega$, i.e. the index of refraction n increases with the wavelength $\lambda$. Suitable materials for the capping layer 308 include, for example, lead selenide (PbSe), lead sulfide (PbS), zinc selenide (ZeSe), zinc sulfide (ZnS), or lead telluride (PbTe). The use of a material showing anomalous dispersion provides for a possibility to use a capping layer 308 of the same thickness for OLEDs emitting different colors.

The capping layer 308 is selected to have the effect that the reflection of external light is reduced, while at the same time the outcoupling through the capping layer 308 for light generated by the OLED is increased. This is a matter of selection of material and thickness, as is described in more detail herein.

Although in FIG. 3 a-c for the different colors the hole transport layers 302 and the electron transport layers 303 are shown as having the same thicknesses, the electron and/or hole transport layers 303, 302 can have different thicknesses for the different colors. In this case the thicknesses of the capping layers 308 can be adapted as well to compensate for these differences in the thicknesses of the electron and/or hole transport layers 302, 303, yielding an even or planar surface. This adaptation can be achieved by choosing material with suitable refractive indices for different wavelengths. That is, the material and/or the refractive indices of the material of the capping layers 308 for the different colors is chosen such that the differences in the optical path lengths for the different colors are the same as the differences in the thicknesses of the electron and/or hole transport layers for the different colors. The optical path lengths are selected such that the reflectance of the entire OLED, i.e. the entire OLED stack, is reduced and the luminous intensity, is increased.

Figure 4:
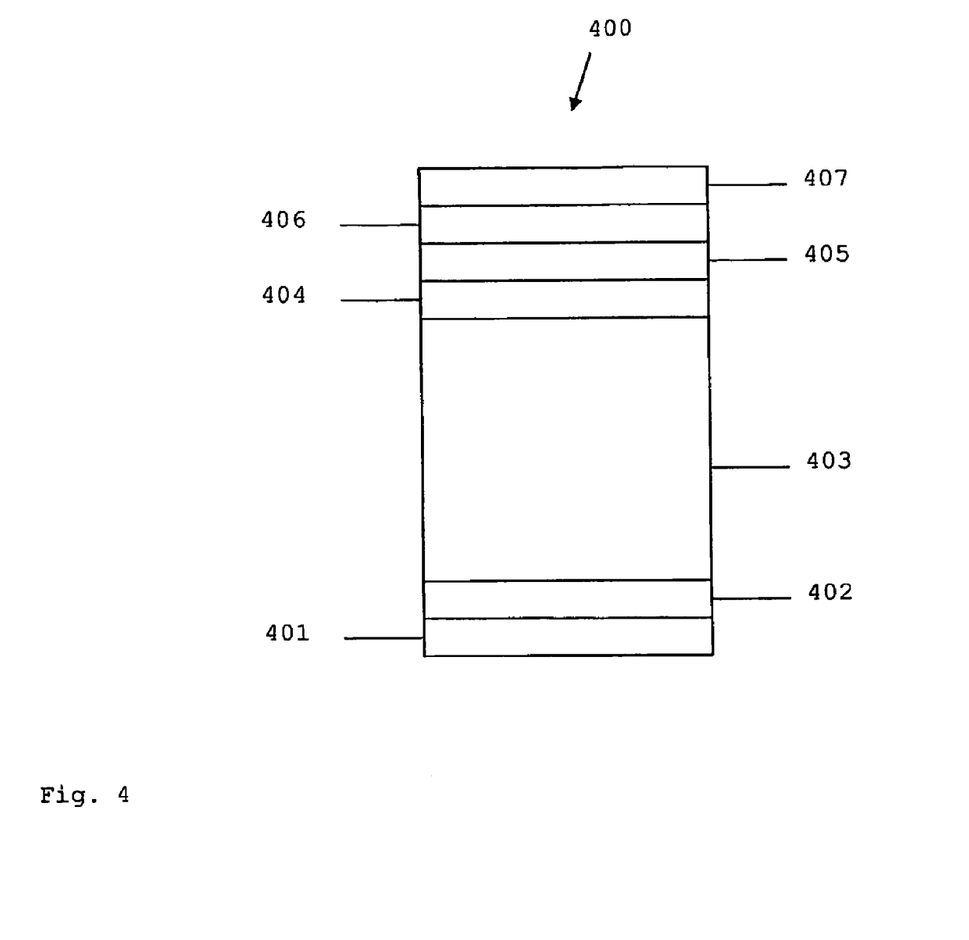
FIG. 4 shows a schematic view of an organic light emitting device according to another embodiment of the present invention.

FIG. 4 shows a schematic view of an OLED 400 according to another embodiment of the present invention. In the embodiment of FIG. 4 the OLED 400 comprises a mirror layer 401 comprising silver. The mirror layer 401 is used to increase the light output of the OLED by reflecting light back. An electrode layer 402 made of indium tin oxide is formed on the mirror layer 401. The ITO layer 402 is used as a first electrode, e.g. the anode, of the OLED 400 and is connected to a power supply (not shown) Alternatively, the anode 402 can be formed of aluminum and the mirror layer 401 can be omitted if the aluminum of the anode 402 is processed such that the anode 402 has a reflectivity.

An active part 403, i.e. an organic part, of the OLED is formed on the anode 402. In the OLED schematically shown in FIG. 4 the active part which serves as an emitting layer of the OLED can be made of $Alq_3$. A preferred thickness of the emitting layer 403 is about 120 nm. Alternatively, the active part 403 can be formed as a multilayer comprising a plurality of sublayers to increase the efficiency of the OLED, as described in conjunction with FIG. 3.

A second electrode layer 404 is formed on the active part 403. The second electrode layer 404 is used as a second electrode 404, e.g. the cathode, of the OLED. In the schematic OLED shown in FIG. 4 the cathode 404 is made of aluminum. Alternatively, the cathode 404 can be formed as a multilayer cathode structure, as described in conjunction with FIG. 3.

A third electrode 405 is formed on the cathode 404. The third electrode 405 is used to control the refractive index of a capping layer 406 which is made of a ferroelectric material or a liquid crystal material and which is formed on the third electrode 405.

A fourth electrode 407 is formed on the capping layer 406. The third electrode 405 and the fourth electrode 407 are used for controlling the refractive index of the capping layer 406.

As already mentioned, ferroelectric materials as well as liquid crystalline materials exhibit the possibility to control their refractive index. Thus, the refractive index and, in conjunction with the refractive index, the optical pathlength of the capping layer 406 formed by such materials can be controlled. Therefore, it is possible to tune the refractive index and to calculate a thickness of the capping layer 406 such that the reflectivity of the whole OLED stack is reduced as well as the outcoupling through of the capping layer 406 is increased. In a descriptive way it can be said that ferroelectric materials and liquid crystalline materials can be controlled to act as materials having an anomalous dispersion, in particular, acting as materials having a controllable dispersion.

By arranging the capping layer 406 comprising a ferroelectric material or a liquid crystal material between the third electrode 405 and the fourth electrode 407, an efficient way for controlling the refractive index of the capping layer 406 is provided. These materials change their refractive index according to the strength of a present electric field. Thus, the refractive index for each color can be set individually, simulating an anomalous dispersion of the capping layer 406, by arranging the capping layer 406 between the third electrode 405 and the fourth electrode 407 and changing the electric field provided by the electrodes 405, 407. Alternatively, the second electrode 404 of the OLED can be used as the third electrode 405 as well. In case of a liquid crystalline material as the capping layer 406, the third electrode 405 is preferably treated in such a way, e.g. with diamond-like carbon, that the liquid crystalline material aligns.

In FIG. 5, results of simulations are shown. The simulations were carried out to show the feasibility of the aspect of the invention that the reflectance and the luminance can be simultaneously improved. In FIG. 5 the simulation result concerning the reflectance of white light and the luminance of the emitted light for red, green and blue light is visualized.

Further, the simulations were carried out on basis of an OLED comprising a glass substrate 309, a first electrode layer 301, e.g. anode layer, made of aluminum having a thickness of about 70 nm, a sublayer made of fluorinated carbon ($CF_x$) having a thickness of about 5 nm, a first sublayer 302 serving as hole transport layer made of NPB having a thickness between about 40 nm and about 80 nm, an emitting layer having a thickness of about 10 nm, an electron transport layer 303 of $Alq_3$ of about 40 nm to about 70 nm thickness, and a second electrode 305-307, e.g. cathode, made of aluminum having a thickness of about 10 nm. A capping layer 308 made of ZnSe is formed on the cathode 305-307. In the simulations, the thickness of the capping layer 308 was varied between 30 nm and 70 nm, in steps of 5 nm. Furthermore, the reflectance and luminance were studied for a wavelength of light between 380 nm and 780 nm wherein the wavelength was varied in steps of 20 nm.

Figure 5A:
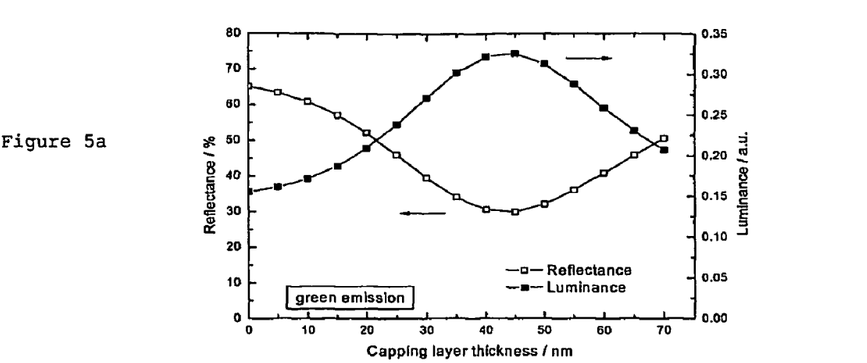
FIG. 5 shows simulation results of related to an OLED according to the present invention.

FIG. 5a shows a diagram illustrating the outcoupled luminance of green light and the reflectance of white light versus the thickness of the capping layer 308 ($Alq_3$: 65 nm, NPB: 55 nm). The thickness was varied between 0 nm and 70 nm. The reflectance shows a decrease from 65% to about 30% at a capping layer thickness of about 45 nm and then an increase to 50% at a capping layer thickness of 70 nm. At the same time the outcoupled luminance increases from a relative value of 0.15 for no capping layer 308 (i.e. a 0 nm capping layer thickness) to a maximum of 0.33 for the same capping layer thickness of 45 nm where the reflectance is a minimum.

Figure 5B:
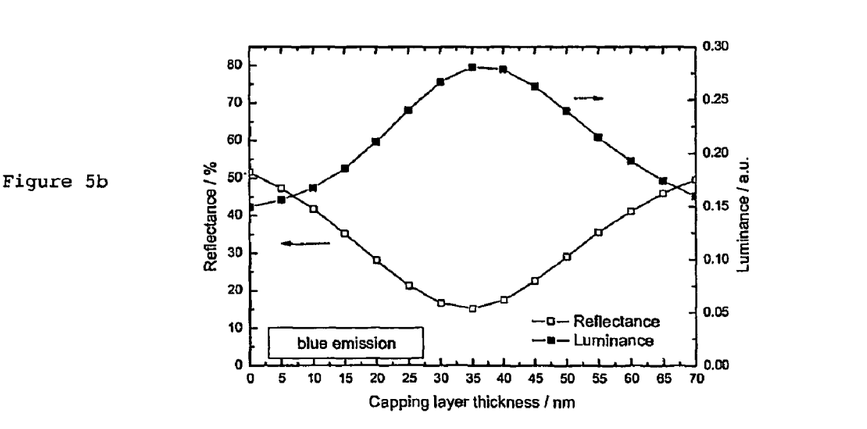

FIG. 5b shows a diagram illustrating the reflectance and the outcoupled luminance of blue light versus the thickness of the capping layer 308. The thickness was varied between 0 nm and 70 nm ($Alq_3$: 55 nm, NPB: 50 nm). The luminance of the blue light shows an increase from 0.15 for no capping layer 308 to a maximum of 0.28 for a corresponding capping layer thickness of 35 nm and then a slight decrease to 0.16 at a capping layer thickness of 70 nm. The corresponding reflectance shows opposing behavior with a minimum of 15% at 35 nm.

Figure 5C:
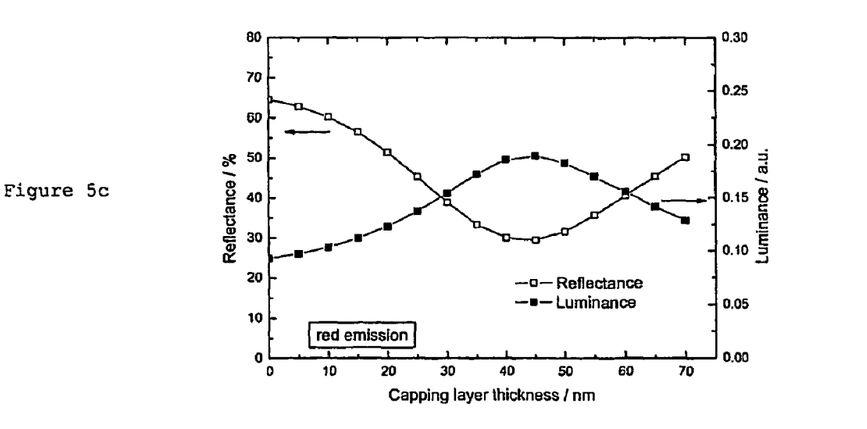

FIG. 5c shows a diagram illustrating the luminance of red light and the reflectance versus the thickness of the capping layer 308. The thickness was varied between 0 nm and 70 nm ($Alq_3$: 70 nm, NPB: 55 nm). The luminance of the red light shows an increase from 0.09 corresponding for no capping layer 308 to a maximum of 0.19 at a capping layer thickness of about 45 nm and then a decrease to 0.13 at a capping layer thickness of 70 nm. The reflectance has a minimum of 19% at 45 nm capping layer thickness as well.

From FIGS. 5a, 5b and 5c it can be seen that it is possible to achieve the maximum of luminance of green, red and blue light substantially at the same thickness of the capping layer corresponding to the minimum of reflectance of white light. The corresponding thickness of the capping layer 308 varies between 35 nm and 45 nm. Thus, the predetermined thickness of the capping layer 308 can be adapted, so that a reflectance of the external light source is reduced whereas the outcoupled luminance of the generated light through the capping layer 308 is increased.

Described herein are ways to fabricate improved displays with substantially only one capping layer thickness for all colors and even to provide OLEDs with electrically tunable optical characteristics. A further benefit of the invention is that capping layers 308 can be tuned such that besides the improved light output, a reduction of reflectivity is obtained to achieve a higher contrast ratio.

Furthermore, beside tuning the thickness of the capping layer 308, the thickness of all layers of the OLED can be tuned to improve the OLED (e.g. by reducing the reflectivity and at the same time increasing the transmittance of the layers), that is, increasing the light output of the OLED. The tuning of the thickness can be achieved by using the effect of destructive interference between rays that are reflected at different boundary surfaces between different layers of the OLED. For destructive interference, a relative phase shift between the rays that are brought into interference of λ/2, i.e. a half of a wavelength, is used.

Although the present invention and its advantages have been described in detail, it should be understood that various changes, substitutions and alterations can be made herein without departing from the spirit and scope of the invention as defined in the appended claims.

The invention claimed is:

1. An organic light-emitting device comprising:
   a first electrode;
   a second electrode;
   at least one layer of organic material, arranged between the first electrode and the second electrode; and
   a dielectric capping layer on the second electrode, the dielectric capping layer comprising a plurality of capping sublayers each with a different refractive index, wherein the refractive indexes of the capping sublayers increase or decrease monotonically with respect to a distance of each individual capping sublayer from the first electrode, and wherein the dielectric capping layer comprises PbSe, PbS, ZnSe, ZnS, or PbTe.

2. The organic light emitting device according to claim 1, wherein the capping layer comprises an anomalous dispersive material.

3. The organic light emitting device according to claim 1, wherein the first electrode comprises indium tin oxide.

4. The organic light emitting device according to claim 1, wherein the second electrode comprises a LiF-layer, an Al-layer, a $Li_2O$-layer, a CsF-layer, a Li-benzoate layer, a Li-acetonate layer, a calcium layer, a magnesium layer, a titanium layer, or a silver layer.

5. The organic light emitting device according to claim 1, wherein the dielectric capping layer has a first thickness in the range of 35 nm to 45 nm, and wherein the organic light emitting device is structured to emit a maximum of luminance of light having a first wavelength between 400 nanometers (nm) to 700 nm and to reflect a minimum of light having a second wavelength incident on the organic light emitting device at the first thickness of the dielectric capping layer.

* * * * *